US012677397B2

(12) United States Patent
Mecca et al.

(10) Patent No.: US 12,677,397 B2
(45) Date of Patent: Jul. 7, 2026

(54) COOLING SYSTEM FOR A WIRELESS POWER TRANSMITTER AND RECEIVER AND METHOD OF USING SAME

(71) Applicant: Aptiv Technologies AG, Schaffhausen (CH)

(72) Inventors: John Mecca, Oakland Township, MI (US); James R. Cook, Poland, OH (US); Evan M. Wallace, Royal Oak, MI (US)

(73) Assignee: Aptiv Technologies AG, Schaffhausen (CH)

( * ) Notice: Subject to any disclaimer, the term of this patent is extended or adjusted under 35 U.S.C. 154(b) by 198 days.

(21) Appl. No.: 18/431,249

(22) Filed: Feb. 2, 2024

(65) Prior Publication Data

US 2024/0268080 A1 Aug. 8, 2024

Related U.S. Application Data

(60) Provisional application No. 63/444,030, filed on Feb. 8, 2023.

(51) Int. Cl.
| | |
|---|---|
| H05K 7/20 | (2006.01) |
| H02J 50/00 | (2016.01) |
| H02J 50/70 | (2016.01) |
| *H02J 50/90* | (2016.01) |

(52) U.S. Cl.
CPC ........ H05K 7/20481 (2013.01); H02J 50/005 (2020.01); H02J 50/70 (2016.02); *H02J 50/90* (2016.02)

(58) Field of Classification Search
CPC ................................................. H05K 7/20481
See application file for complete search history.

(56) References Cited

U.S. PATENT DOCUMENTS

| | | | |
|---|---|---|---|
| 2021/0099026 A1 | 4/2021 | Larsson et al. | |
| 2022/0045527 A1* | 2/2022 | Karanikos | H01F 27/366 |
| 2022/0166256 A1 | 5/2022 | Chen | |

(Continued)

FOREIGN PATENT DOCUMENTS

| | | | | |
|---|---|---|---|---|
| CN | 108233497 A | * | 6/2018 | H01F 27/22 |
| CN | 112383153 A | * | 2/2021 | H02J 50/10 |
| CN | 112886679 A | | 6/2021 | |

(Continued)

OTHER PUBLICATIONS

CN 112383153 A English translation (Year: 2021).*
CN 108233497 A English translation (Year: 2018).*
"Extended European Search Report mailed on Aug. 23, 2024".

*Primary Examiner* — Mukundbhai G Patel
(74) *Attorney, Agent, or Firm* — Billion & Armitage

(57) ABSTRACT

Systems, methods, and devices for wireless charging are described. A wireless transmitter includes a source coil and an array of alignment magnets around the source coil. The wireless transmitter further includes a heat sink that is arranged in thermal contact with the array of alignment magnets to create a thermal path from the array of alignment magnets to the heat sink. In some examples, the heat sink includes a thermal interface arranged in thermal contact with opposed surface(s) of the array of alignment magnets that are opposite the active surface(s) of the alignment magnets used for magnetic alignment of a wireless power receiver.

18 Claims, 3 Drawing Sheets

(56)          References Cited

U.S. PATENT DOCUMENTS

2022/0311286  A1      9/2022  Schwartz
2022/0352753  A1     11/2022  Powell et al.

FOREIGN PATENT DOCUMENTS

| CN | 112928791 | A | 6/2021 |
| CN | 214800299 | U | 11/2021 |
| CN | 216650315 | U | 5/2022 |
| CN | 217608193 | U | 10/2022 |
| CN | 218277490 | U | 1/2023 |
| CN | 218678551 | U | 3/2023 |
| CN | 219181246 | U | 6/2023 |
| CN | 219436715 | U | 7/2023 |
| CN | 219437441 | U | 7/2023 |

* cited by examiner

310

350

350

342

600

601

ARRANGE AN ARRAY OF ALIGNMENT MAGNETS AROUND A SOURCE COIL.

602

ARRANGE A HEAT SINK IN THERMAL CONTACT WITH AT LEAST A PORTION OF THE ARRAY OF ALIGNMENT MAGNETS TO CREATE A THERMAL PATH FROM THE ARRAY OF ALIGNMENT MAGNETS TO THE HEAT SINK.

COOLING SYSTEM FOR A WIRELESS POWER TRANSMITTER AND RECEIVER AND METHOD OF USING SAME

CROSS-REFERENCE TO RELATED APPLICATION

This application claims benefit of priority to U.S. Provisional Patent Application No. 63/444,030 filed on Feb. 8, 2023, the entire disclosure of which is hereby incorporated by reference.

TECHNICAL FIELD OF THE INVENTION

The invention generally relates to a wireless power transmission system for charging batteries in a consumer electronic device, particularly a cooling system for a wireless power transmitter having an array of alignment magnets.

BACKGROUND

Wireless power transmission systems, such as the MAGSAFE® wireless power transmission system developed by Apple, Inc. of Cupertino, California or the Qi2.0 Magnetic Power Profile (MPP) developed by the Wireless Power Consortium, uses an array of alignment magnets in the wireless power transmitter of a charging device that interface with a corresponding array of alignment magnets in the wireless power receiver housed within a consumer electronic device. The magnets in the transmitter and the receiver have compatible polarizations that cause the receiver to be properly aligned with the transmitter and provide physical retention of the receiver to the transmitter. This provides optimal alignment between a receiver coil in the receiver and a source coil in the transmitter, thereby allowing a maximum power transmission between the transmitter and the receiver.

Typically, active cooling systems for these wireless power transmission systems use a fan that is mounted on the wireless power transmitter to intake or exhaust air through an air duct built into the wireless power transmitter in the interface surface between the wireless power transmitter and a wireless power receiver. During charging, this air flow typically blows directly onto the receiver through holes in the interface surface to cool the wireless power receiver or blows under the interface surface to insulate the wireless power receiver from heat generated by the wireless power transmitter.

Cooling systems that intake air from areas in the automobile located below the wireless power transmitter can be subject to higher air flow temperatures. These areas are located below the vehicle console/trim are not climate controlled and will contain hotter air than the passenger cabin during high outside temperature conditions, thereby reducing cooling efficiency in the scenario where the cooling is most needed. Alternative cooling systems draw from the climate-controlled passenger cabin and exhaust it below the wireless power receiver do not have this problem. However, these configurations usually have a wireless power transmitter with a larger package size, especially in the Z/height direction in order to fit the necessary mounting and ducting features to maintain system pressure low enough for the fan to generate sufficient cooling airflow.

SUMMARY

Systems, methods, and devices are described that incorporate structures arranged to dissipate heat from one or more of the wireless power transmitter and a wireless power receiver charged by the wireless power transmitter. The described solutions may offer increased performance to dissipate heat, and may be less expensive and/or less complicated to implement in comparison to traditional wireless charging solutions.

As an example, a wireless power transmitter is described that includes a source coil and an array of alignment magnets around the source coil. The wireless power transmitter further includes at least one heat sink arranged in thermal contact with at least a portion of the alignment magnets to create a thermal path from the array of alignment magnets to the heat sink.

As another example, a method of forming a wireless transmitter is described. The method includes arranging an array of alignment magnets around a source coil. The method further includes arranging a heat sink in thermal contact with at least a portion of the array of alignment magnets to create a thermal path from the array of alignment magnets to the heat sink.

BRIEF DESCRIPTION OF THE DRAWINGS

The present invention will now be described, by way of example with reference to the accompanying drawings, in which.

DETAILED DESCRIPTION

With the development of magnetic device alignment wireless charging systems, e.g., the MAGSAFE® wireless power transmission system developed by Apple, Inc. or the Qi2.0 Magnetic Power Profile (MPP) developed by the Wireless Power Consortium, a new thermal conduction path has been established. Magnets are used to align the wireless power transmitter and wireless power receiver of the wireless power transmission systems. These alignment magnets have an increased thermal conductivity compared to the mostly plastic interfaces in traditional wireless power transmission systems. Additionally, these alignment magnets are located very close to the interface between the wireless power transmitter and wireless power receiver. This allows for heat to be transferred by conduction from the wireless power transmitter and/or the wireless power receiver more readily. Since the alignment magnets in both the wireless power transmitter and wireless power receiver are aligned and attractive to each other, this provides a thermal path to transfer heat through conduction. Cooling of the alignment magnets in the wireless power transmitter will conduct heat from the corresponding alignment magnets in the hotter wireless power receiver thus cooling the wireless power receiver more effectively than using direct or indirect airflow to cool the wireless power receiver. This improved cooling will allow the wireless power receiver to charge at higher power levels without the wireless power receiver overheating and thereby forcing the wireless charging systems to operate at lower power levels and thus complete charge sessions quicker, resulting in an improved user experience. In summary, the problem of keeping the wireless power receiver cool during wireless charging is solved by conducting heat away from the wireless power receiver using the alignment magnets as a heat path to a heat sink.

This disclosure is directed to a cooling system for a wireless power transmitter having an array of alignment magnets. For example, the problem of a wireless power transmitter having an array of alignment magnets arranged around a source coil in the wireless power transmitter overheating may be solved by placing a magnetic or non-magnetic heat sink in thermal contact with the array of alignment magnets, thereby making the alignment magnet array a component of the cooling system, since the material forming the alignment magnets has high thermal conductivity. Since the array of alignment magnets in the wireless power transmitter are in close proximity to a corresponding array of alignment magnets in the wireless power receiver, the cooling system may also use the array of alignment magnets in the wireless power transmitter to conduct heat away from the wireless power receiver.

Figures 1, 2:
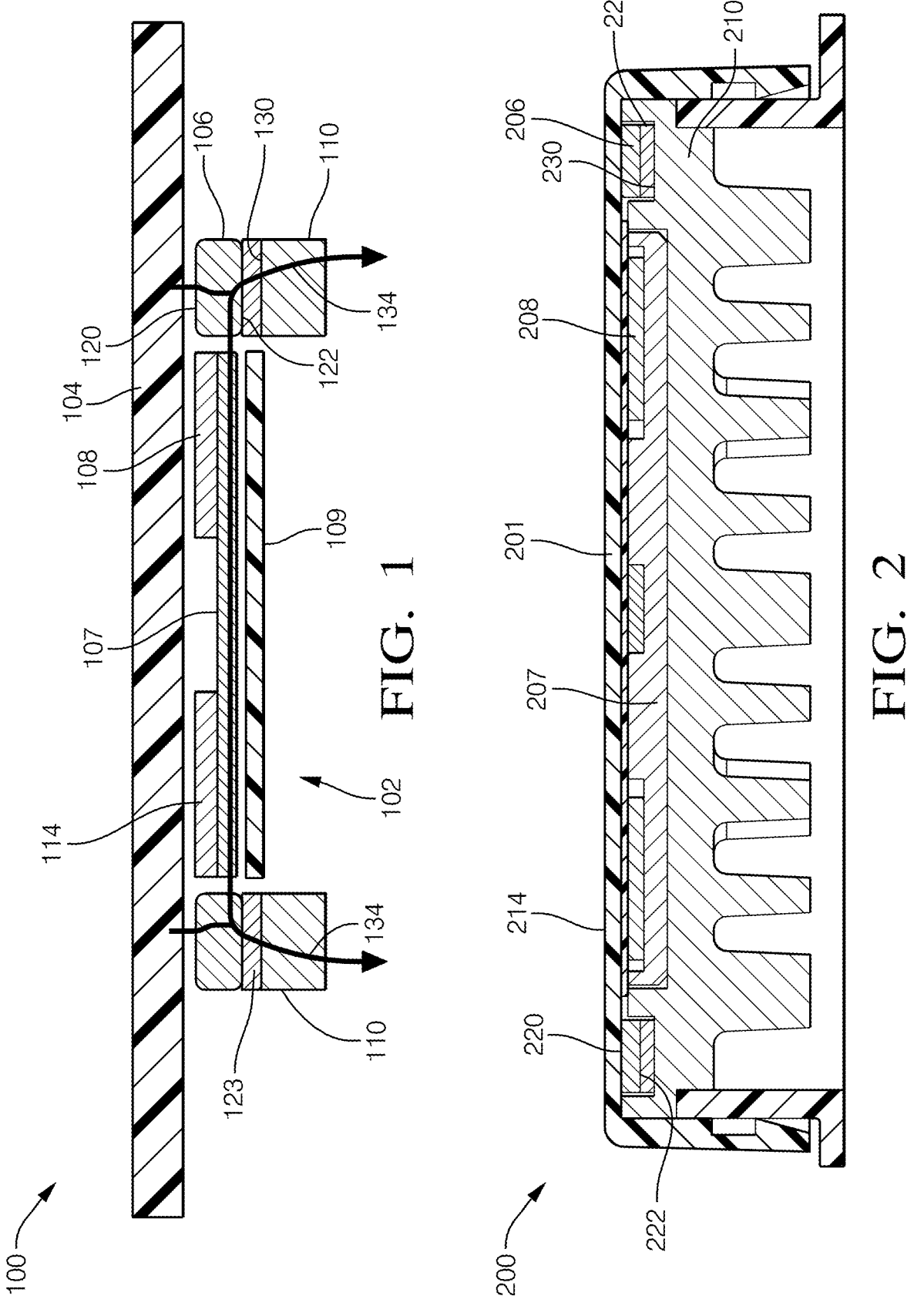
FIG. 1 is a schematic side view of a wireless power transmitter having a heat sink that is in thermal communication with the transmitter's alignment magnets in accordance with some embodiments.
FIG. 2 is a schematic side view of another example of a wireless power transmitter having a heat sink that is in thermal communication with the transmitter's alignment magnets in accordance with some embodiments.

An example of a cooling system 100 for a wireless power transmitter 102 and a wireless power receiver 104 is shown in FIG. 1. The wireless power transmitter 102 includes an array of alignment magnets 106 arranged around a source coil 108 that is mounted on a ferrite sheet or plate 107. In the depicted example, alignment magnets 106 are arranged at a periphery of the ferrite sheet 107, i.e., alignment magnets 106 are not mounted on a planar surface of the ferrite sheet 107 like source coil 108. In some examples, the alignment magnets 106 surround the ferrite sheet 107 and the source coil 108, as shown in the FIG. 1 example. The alignment magnets 106 may be formed of a neodymium material which has good thermal conductivity (approx. 9 W/m–K).

The cooling system 100 also includes a heat sink 110 that is formed of a material having very high thermal conductivity and high thermal capacity, e.g., a nonmagnetic cast aluminum or other aluminum-based material. In other examples, the heat sink 110 is formed of a magnetic material, such as steel. The heat sink 110 is in thermal contact with at least a portion of the array of alignment magnets 106 and preferably in thermal contact with all of the alignment magnets 106 in the array. The heat sink 110 may also be in thermal contact with the ferrite sheet 107, source coil 108 and printed circuit board (PCB) 109 in the wireless power transmitter 102. In some embodiments the ferrite sheet 107 may be mounted on or in close proximity to the circuit board 109. In other embodiments the circuit board 109 may be located in a location remote from ferrite sheet 107 and source coil 108.

In some examples, the source coil 108 has a substantially annular shape, and the array of alignment magnets 106 are arranged with a corresponding annular shape surrounding the source coil 108. In some examples, the alignment magnets 106 are arranged to interact with a corresponding array of alignment magnets (not shown) that similarly surround a receiver coil (not shown) of wireless power receiver 104 at an interface surface 114 of the wireless power transmitter 102, to align the receiver coil with source coil 108 for charging wireless power receiver 104.

As shown in the FIG. 1 example, alignment magnets 106 of wireless power transmitter 102 includes active surface(s) 120, which interact with wireless power receiver 104, to align wireless power receiver 104 for charging wireless power receiver 104. Alignment magnets 106 also include opposed surface(s) 122, which are opposite the active surface(s) 120. Wireless transmitter 102 may optionally include magnetic shielding 123 at the opposed surface(s) 122, as also shown in the FIG. 1 example. In some examples, magnetic shielding 123 includes a plurality of annularly shaped plates that alignment magnets 106 rest upon.

As shown in FIG. 1, heat sink 110 includes a thermal surface 130 that is arranged in proximity to opposed surface(s) 122 of the alignment magnets 106, for example such that a thermal path 134 is created from opposed surface(s) 122 to heat sink 110. For example, thermal path 134 may be enabled from wireless power transmitter 102, wireless power receiver 104 (e.g., from receiver coils and/or corresponding alignment magnets (not shown) of wireless power receiver 104) through alignment magnets 106, to heat sink 110. In some examples not depicted in FIG. 1, heat sink 110 is arranged such that thermal surface 130 is in direct contact with opposed surface(s) 122. In some examples, a thermally conductive paste or other thermally conductive material may be applied between the alignment magnets 106 and the heat sink 110. In other embodiments, magnetic shielding 123 is comprised of thermally conductive material and heat sink 110 is arranged such that thermal surface 130 of the heat sink 110 is in contact with magnetic shielding 123, providing the thermal path 134 from alignment magnet 106 to heat sink 110 via magnetic shielding 123. In other examples, a thermally conductive paste or other thermally conductive material may be applied between the alignment magnets 106 and magnetic shielding 123 and/or between the magnetic shielding 123 and the heat sink 110.

In some examples, thermal surface 130 of the heat sink 110 is arranged to substantially cover opposed surface(s) 122 of the alignment magnets 106 to maximize thermal transfer. In some examples, heat sink 110 is arranged to present a thermal surface 130 that is similarly sized and shaped to opposed surface(s) 122 of alignment magnets 106 and/or magnetic shielding 123, as shown in the FIG. 1 example. In other examples not depicted, heat sink 110 may include a thermal surface 130 larger than or of a different shape than opposed surface(s) 122, such as a square or rectangular shape. In some examples, alignment magnets 106 are retained by heat sink 110. In other examples, alignment magnets 106 are embedded in heat sink 110.

Additionally, interface surface 114 of the wireless power transmitter 102 may be a surface of a housing (not shown in FIG. 1) of the wireless power transmitter 102 that is formed of a material that is electrically insulative, nonmagnetic, and thermally conductive. The electrically insulative and non-magnetic properties prevent interference and/or blocking of wireless charging power delivered from the wireless power transmitter 102 to the wireless power receiver 104. The thermally conductive properties allow for heat generated by the wireless power receiver 104 to be distributed to the array of alignment magnets 106 and thereby distributed to the heat sink 110 via thermal path 134. This inhibits overheating of the wireless power receiver 104 by improving heat dissipation from the wireless power receiver 104. For example, the interface surface 114 may be formed of a boron nitride (BN)

doped polymer material that provides the desired characteristics of being electrically insulative, nonmagnetic, and thermally conductive.

Another example of a cooling system 200 for a wireless power transmitter 202 is shown in FIG. 2. The wireless power transmitter 202 includes an array of alignment magnets 206 arranged around a source coil 208 that is mounted on a ferrite sheet or plate 207 housed in a cover 201 that includes an interface surface 214 upon which a wireless power receiver may be arranged for wireless charging. In the depicted example, alignment magnets 206 are arranged at a periphery of the ferrite sheet 207, i.e., alignment magnets 206 are not mounted on a planar surface of the ferrite sheet 207 like source coil 208. The alignment magnets 206 surround the ferrite sheet 207 and the source coil 208, as shown in the FIG. 2 example. The alignment magnets 206 may be formed of a neodymium material which has good thermal conductivity (approx. 9 W/m–K).

The alignment magnets 206 include active surface(s) 220 and opposed surface(s) 222, and magnetic shielding 223 at the opposed surface 222. The cooling system 200 further includes a heat sink 210 with a thermal surface 230 in thermal contact with the opposed surface(s) 222 of the alignment magnets 206, via magnetic shielding 223. In some examples, a thermally conductive paste or other thermally conductive material may be applied between the alignment magnets 206 and magnetic shielding 223 and/or between the magnetic shielding 223 and the heat sink 210.

In some examples, the heat sink 210 retains the ferrite sheet 207 and source coil 208. In some examples, the heat sink 210 retains the alignment magnets 206 and magnetic shielding 223. For example as shown in FIG. 2, the magnetic shielding 223 and magnets 206 are situated upon heat sink 210. As also shown in the FIG. 2 example, thermal surface 230 covers the entirety of magnetic shielding 223, which covers the entirety of opposed surface 222.

As also shown in the FIG. 2 example, alignment magnets 206 and magnetic shielding 223 are also embedded in heat sink 210, as in portions of heat sink 210 extend into thermal contact with the sides of the alignment magnets 206 and/or magnetic shielding 223. In some examples, heat sink 210 may be formed of a unitary construction that includes these side-contact portions. In other examples, a thermally conductive paste may be applied in contact with the sides of the alignment magnets 206/magnetic shielding 223 and the heat sink 210.

Figures 3, 4:
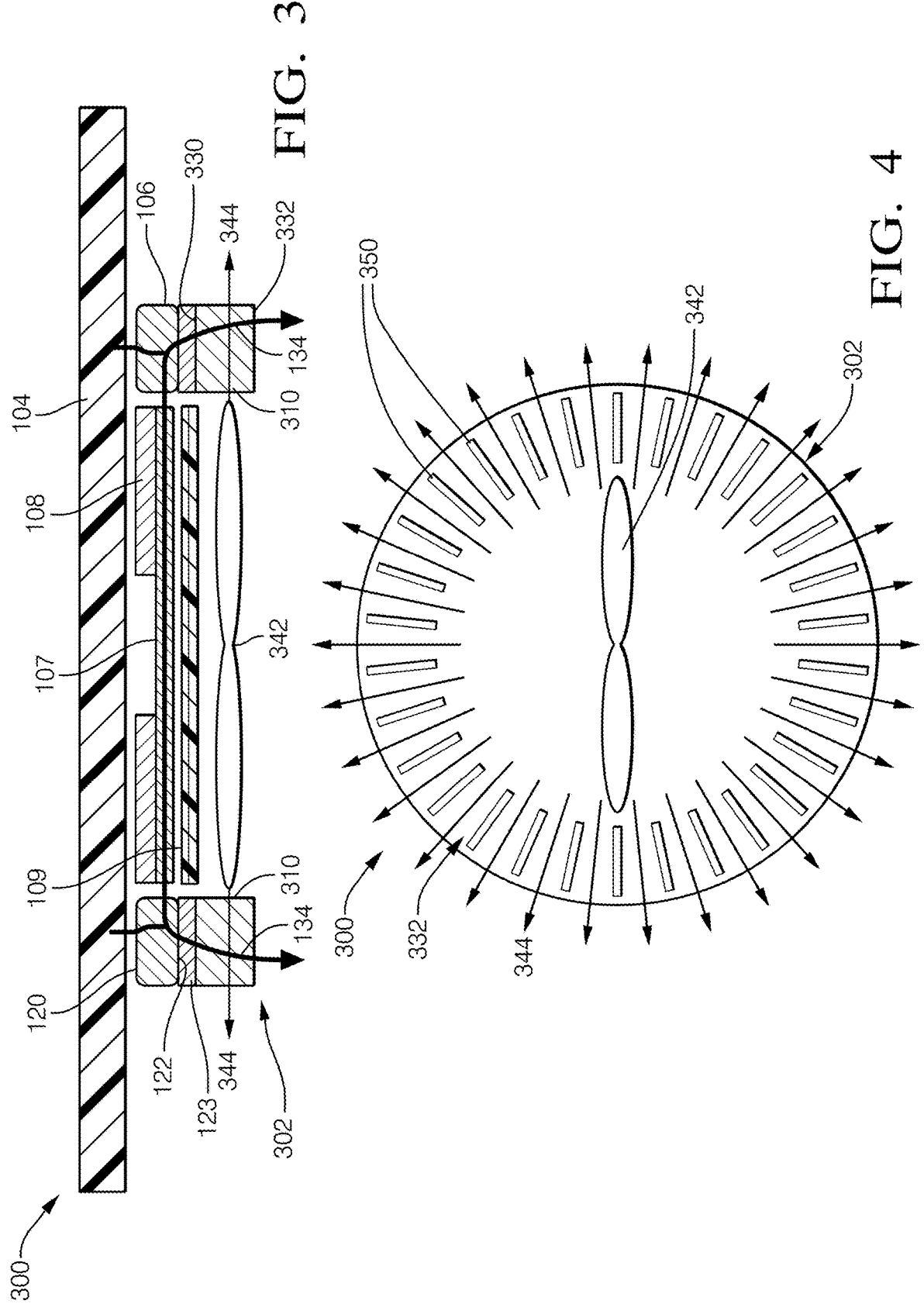
FIG. 3 is a schematic side view of a wireless power transmitter having a fan disposed within a radial heat sink that is in thermal communication with the transmitter's alignment magnets in accordance with some embodiments.
FIG. 4 is a schematic bottom view of the wireless power transmitter of FIG. 3 in accordance with some embodiments.
Figures 5, 6:
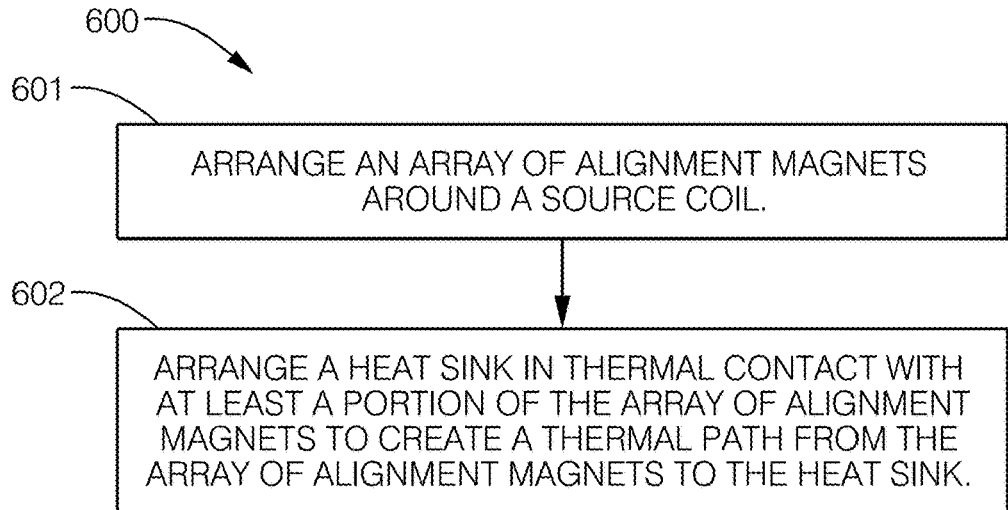
FIG. 5 is an isometric view of the radial heat sink and fan of FIG. 3 in accordance with some embodiments.
FIG. 6 is a flow diagram depicting one example of a method of forming a wireless power transmitter in accordance with some embodiments.

Yet another example of a cooling system 300 for a wireless power transmitter 302 and a wireless power receiver 304 is shown in FIGS. 3 through 5. The wireless power transmitter 302 is substantially similar to wireless power transmitter 102 depicted in FIG. 1 and includes an array of alignment magnets 106 arranged around a source coil 108 mounted on a ferrite sheet or plate 107. In some embodiments the ferrite sheet 107 may be mounted on or in close proximity to a circuit board 109. In other embodiments the circuit board 109 may be located in a location remote from ferrite sheet 107 and source coil 108.

The cooling system 300 also includes a heat sink 310 that is formed of a material having very high thermal conductivity and high thermal capacity. The heat sink 310 includes a thermal surface 330 that is arranged in proximity to opposed surface(s) 122 of the alignment magnets 106, for example such that a thermal path 134 is created from opposed surface(s) 122 to heat sink 310. Wireless power transmitter 302 may optionally include magnetic shielding 123 at the opposed surface(s) 122 of the alignment magnets 106. In some examples, a thermally conductive paste or other thermally conductive material may be applied between the alignment magnets 106 and magnetic shielding 123 and/or between the magnetic shielding 123 and the heat sink 310.

In some examples not depicted in FIG. 3, heat sink 310 is arranged such that thermal surface 330 is in direct contact with opposed surface(s) 122 of the alignment magnets 106. The heat sink 310 is also preferably in physical contact with at least a portion of the array of alignment magnets 106 and more preferably in physical contact with all of the alignment magnets 106 in the array.

Referring to FIGS. 4 and 5, heat sink 310 has a plurality of cooling fins 350 extending from the side 332 of the heat sink 310 located opposite the array of alignment magnets 106 (and opposite to thermal surface 330). As shown in FIG. 4, the cooling fins 350 may be in a radial arrangement.

As shown in FIGS. 3, 4, and 5, this cooling system 300 may also include an air movement device 342, such as a fan, which is configured to create an air flow 344 between the cooling fins 350. As shown in FIGS. 3 and 4, the air movement device 342 may be configured to create an air flow 344 that flows from an interior area of the cooling fins 350 to an area exterior to the cooling fins 350. Alternatively, the device 342 may be configured to draw air from the area exterior to the cooling fins 350 to the interior area of the cooling fins 350.

Alternative embodiments of the cooling system may be envisioned that include a combination of features from any one of the various example cooling systems 100, 200, 300 presented herein.

The cooling systems 100, 200, 300 presented herein provide the benefit of improved cooling by incorporating the array of alignment magnets 106, 206 of the wireless power transmitter 102, 202, 302 into the cooling systems 100, 200, 300.

FIG. 6 is a flow diagram that depicts one example of a method 600 of forming a wireless transmitter according to some embodiments. As shown in FIG. 6, the method includes, at step 601, arranging an array of alignment magnets (e.g., 106, 206) around a source coil (e.g., 108, 208). In some examples, the method includes arranging the array of alignment magnets around the source coil and a ferrite sheet (e.g., 107, 207) upon which the source coil is mounted.

As also shown in FIG. 6, at step 602, the method further includes arranging a heat sink (e.g., 110, 210, 310) in thermal contact with at least a portion of the array of alignment magnets (e.g., 106, 206) and/or magnetic shielding (e.g., 123, 223) in contact with the alignment magnets to create a thermal path (e.g., 134) from the array of alignment magnets to the heat sink. In some examples, the array of alignment magnets include active surface(s) (e.g., 120, 220) configured to be arranged in proximity to a wireless power receiver (e.g., 104), and opposed surface(s) (e.g., 122, 222) opposite the active surface(s). The heat sink may include a thermal surface (e.g., 130, 230, 330) arranged in direct contact with or close proximity to the opposed surface(s). In some examples, the method further includes arranging the array of alignment magnets, ferrite sheet, source coil, and/or circuit board (e.g., 109) within a housing and/or cover (e.g., 201).

In some examples, the method includes arranging a heat sink formed of a nonmagnetic material, such as aluminum, cast aluminum, or other non-magnetic material. In other examples, the method includes arranging a heat sink formed of a magnetic material, such as steel. In some examples, arranging the heat sink includes retaining the array of alignment magnets. In some examples, arranging the heat sink includes embedding the array of alignment magnets in the heat sink such that the heat sink substantially surrounds the alignment magnets and/or the magnetic shielding.

In some examples, arranging the heat sink creates a thermal path from the source coil to the array of alignment magnets to the heat sink. In some examples, arranging the heat sink creates a thermal path from a wireless power receiver (e.g., 104) to the array of alignment magnets to the heat sink. In some examples, arranging the heat sink creates a thermal path from a corresponding plurality of magnets (not shown) of the wireless power receiver to the heat sink. In some examples, the method includes arranging the heat sink proximal to the array of alignment magnets without a magnetic shielding or ferrite sheet between the heat sink and the array of alignment magnets.

While this invention has been described in terms of the preferred embodiments thereof, it is not intended to be so limited, but rather only to the extent set forth in the claims that follow. For example, the above-described embodiments (and/or aspects thereof) may be used in combination with each other. In addition, many modifications may be made to configure a particular situation or material to the teachings of the invention without departing from its scope. Dimensions, types of materials, orientations of the various components, and the number and positions of the various components described herein are intended to define parameters of certain embodiments and are by no means limiting and are merely prototypical embodiments.

Many other embodiments and modifications within the spirit and scope of the claims will be apparent to those of skill in the art upon reviewing the above description. The scope of the invention should, therefore, be determined with reference to the following claims, along with the full scope of equivalents to which such claims are entitled.

As used herein, 'one or more' includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

Additionally, while terms of ordinance or orientation may be used herein these elements should not be limited by these terms. All terms of ordinance or orientation, unless stated otherwise, are used for purposes distinguishing one element from another, and do not denote any particular order, order of operations, direction or orientation unless stated otherwise.

We claim:

1. A wireless power transmitter, comprising:

an array of alignment magnets arranged around a source coil in the wireless power transmitter, the array of alignment magnets including an active surface that interacts with a corresponding array of alignment magnets in a wireless power receiver and an opposed surface that is oppose the active surface; and a heat sink in thermal contact with at least a portion of the array of alignment magnets to create a thermal path from the array of alignment magnets to the heat sink, the heat sink arranged in thermal contact with the opposed surface of the array of alignment magnets, the thermal contact between the heat sink and the opposed surface of the array of alignment magnets includes at least one i.) a thermal surface of the heat sink directly contacting the opposed surface of the array of alignment magnets and ii.) the thermal surface of the heat sink directly contacting magnetic shielding that directly contacts the opposed surface of the array of alignment magnets.

2. The wireless power transmitter of claim 1, wherein the heat sink is arranged in thermal contact with the array of alignment magnets via magnetic shielding between the heat sink and the array of alignment magnets.

3. The wireless power transmitter of claim 1, wherein the heat sink includes a thermal surface arranged in thermal contact with the opposed surface of the array of alignment magnets.

4. The wireless power transmitter of claim 1, wherein the thermal surface of the heat sink directly contacts magnetic shielding that directly contacts the opposed surface of the array of alignment magnets.

5. The wireless power transmitter of claim 1, wherein the thermal surface of the heat sink directly contacts the opposed surface of the array of alignment magnets.

6. The wireless power transmitter of claim 1, wherein the array of alignment magnets is a first array of alignment magnets, and wherein the thermal path extends from a second, corresponding array of alignment magnets of a wireless power receiver to the heat sink.

7. The wireless power transmitter according to claim 1, wherein the heat sink is formed of a nonmagnetic material.

8. The wireless power transmitter according to claim 7, wherein the array of alignment magnets are embedded within the heat sink.

9. The wireless power transmitter according to claim 1, wherein the heat sink is formed of one or more of aluminum, cast aluminum, and steel.

10. The wireless power transmitter according to claim 1, wherein the array of alignment magnets are retained by the heat sink.

11. A wireless power transmitter comprising:

an array of alignment magnets arranged around a source coil in the wireless power transmitter; and a heat sink in thermal contact with at least a portion of the array of alignment magnets to create a thermal path from the array of alignment magnets to the heat sink, wherein the thermal path extends from the source coil and/or a ferrite sheet upon which the source coil is mounted to the heat sink through the array of alignment magnets.

12. The wireless power transmitter of claim 11, wherein the source coil is arranged on the ferrite sheet, and wherein the array of alignment magnets are arranged around a periphery of the ferrite sheet.

13. The wireless power transmitter of claim 12, wherein the ferrite sheet is not between the array of alignment magnets and the heat sink.

14. A method of forming a wireless power transmitter, comprising:

arranging an array of alignment magnets around a source coil;

arranging a heat sink in thermal contact with at least a portion of the array of alignment magnets to create a thermal path from the array of alignment magnets to the heat sink; and arranging the heat sink to create the thermal path that extends from the source coil and/or a ferrite sheet upon which the source coil is mounted to the heat sink through the array of alignment magnets.

15. The method of claim 14, wherein the array of alignment magnets include an active surface that interacts with a corresponding array of alignment magnets in a wireless power receiver, and an opposed surface that is opposite the active surface; and further comprising:

arranging the heat sink in thermal contact with the opposed surface of the array of alignment magnets.

16. The method of claim 14, wherein the array of alignment magnets is a first array of alignment magnets, and further comprising:

arranging the heat sink to create the thermal path that extends from a second, corresponding array of alignment magnets of a wireless power receiver to the heat sink.

17. The method of claim 14, wherein arranging the array of alignment magnets around a source coil comprises arranging the array of alignment magnets around the ferrite sheet upon which the source coil is mounted.

18. The method of claim 14, wherein the heat sink is formed of one or more of aluminum, cast aluminum, and steel.

* * * * *